United States Patent
Manganaro

(10) Patent No.: US 7,023,367 B1
(45) Date of Patent: Apr. 4, 2006

(54) CURRENT STEERING DIGITAL TO ANALOG CONVERTER WITH IMPROVED DYNAMIC LINEARITY

(75) Inventor: Gabriele Manganaro, Boxborough, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/077,742

(22) Filed: Mar. 10, 2005

(51) Int. Cl.
  *H03M 1/00* (2006.01)
(52) U.S. Cl. ...................................... 341/136; 341/144
(58) Field of Classification Search ................ 341/136, 341/144, 130–135, 127, 118, 120
  See application file for complete search history.

(56) References Cited

U.S. PATENT DOCUMENTS

| | | | | |
|---|---|---|---|---|
| 5,136,293 | A | * | 8/1992 | Matsuo et al. ............... 341/144 |
| 5,825,317 | A | * | 10/1998 | Anderson et al. ........... 341/120 |
| 5,909,187 | A | * | 6/1999 | Ahuja .......................... 341/136 |
| 6,211,583 | B1 | * | 4/2001 | Humphreys .................. 307/131 |
| 6,353,402 | B1 | * | 3/2002 | Kanamori .................... 341/118 |
| 6,445,322 | B1 | * | 9/2002 | Watson ........................ 341/144 |
| 6,664,906 | B1 | * | 12/2003 | Volk ............................. 341/118 |
| 6,927,714 | B1 | * | 8/2005 | Teterwak .................... 341/136 |

OTHER PUBLICATIONS

W. Schofield, et al., "A 16b 400MS/s DAC with <-80dBc IMD to 300MHz and <160dBm/Hz Noise Power Spectral Density," ISSCC 203/Session 7/DACs AND AMPs/Paper 7.1, 2003 IEEE International Solid-State Circuits Conference, 10 pages, no month.
Douglas Mercer, "A 16-b D/A Converter with Increased Spurious Free Dynamic Range," IEEE Journal of Solid-State Circuits, vol. 29, No. 10, Oct. 1994, pp. 1180-1185.

* cited by examiner

*Primary Examiner*—Linh V. Nguyen
(74) *Attorney, Agent, or Firm*—Patent Law Group LLP; Carmen C. Cook

(57) ABSTRACT

A current source cell includes a current source providing a first current at a first node where variations of a first voltage at the first node results in variations of the first current, and first and second switches coupled between the first node and respective first and second output terminals. A control signal is coupled to selectively apply a first drive voltage to a selected one of the first and second switches to close the selected switch to steer the first current to the corresponding output terminal. The current source cell further includes a voltage adjustment circuit coupled to detect variations in the first voltage and vary the first drive voltage in response to the variations in the first voltage. The first drive voltage applied to the selected switch is varied to reduce the variations in the first voltage, thereby maintaining the first voltage at a substantially stable voltage value.

21 Claims, 4 Drawing Sheets

CURRENT STEERING DIGITAL TO ANALOG CONVERTER WITH IMPROVED DYNAMIC LINEARITY

FIELD OF THE INVENTION

The invention relates to current steering digital to analog converters and, in particular, to a current steering digital to analog converter with improved dynamic linearity over a large frequency range.

DESCRIPTION OF THE RELATED ART

High speed current steering digital to analog (D/A) converters are the most common architecture used in wireless and wired modern communication and video rate applications. One of the performance limitations affecting this class of D/A converters is high-frequency harmonic distortion, known also as dynamic linearity. A variety of techniques are available to ensure virtually ideal linearity for the output signals at low or near zero frequency. Examples of these techniques include trimming and calibration of the D/A converters. However, as the frequency of the converted signal increases from zero toward half of the output rate Frequency $F_S$, where $F_S/2$ is also referred to as the "Nyquist Frequency," the power of the spurious harmonics increases and the quality of the conversion is degraded. The introduction of such unwanted spurious components is referred to as harmonic distortion.

Current-steering digital-to-analog converters (D/A converters or DACs) are formed by identical or properly sized arrays of "current source cells." FIG. 1, which includes FIGS. 1(a), 1(b) and 1(c), is a circuit diagram of a conventional current source cell in a PMOS based implementation. Referring to FIG. 1(a), current source cell 10 includes a current source 12 represented by a circuit model including a current source I, a capacitor C, and a resistor R. The capacitor and resistor can be linear or nonlinear elements depending on the actual implementation. Current source 12 also includes an output device. Most commonly, a cascode transistor $M_C$ is used as shown in FIG. 1. Cascode transistor $M_C$ provides a DC output impedance magnification approximately equal to its so-called intrinsic gain $g_{Mc}/g_{dsc}$, where $g_{Mc}$ is the transconductance of transistor $M_C$ and $g_{dsc}$ is the conductance looking into the drain terminal of transistor $M_C$. In other words, without the cascode transistor, the DC output impedance of current source 12 is the resistance of resistor R in parallel with the capacitance of capacitor C. With the cascode transistor incorporated, the output resistance of current source 12 becomes $R*g_{Mc}/g_{dsc}$. The cascode transistor thus provides a magnification of the impedance looking into the current source. Current source 12 provides an output current $I_O$ as the source current into a node 15.

In current source cell 10, the source current $I_O$ is steered completely toward a positive output terminal O1 or a negative output terminal O2 by means of a source-coupled pair of transistors $M_{S1}$ and $M_{S2}$. The source-coupled pair of transistors $M_{S1}$ and $M_{S2}$ function as the current steering switches. The source current $I_O$ is steered into the desired output terminal (O1 or O2) by a control signal $Q_K$ which is the output state of a latch 14 (FIG. 1(b)). Latch 14 receives the digital data signal $D_K$ to be converted and a clock signal and operates to provide the control signal $Q_K$ and its inverse. Control signal $Q_K$ is coupled to drive switches S1 to S4 so that the gate voltages $V_p$ and $V_n$ of the respective source-coupled transistors $M_{S1}$ and $M_{S2}$ will be held to either one of two reference voltage levels $V_{HI}$ and $V_{LO}$. The two DC reference voltages $V_{HI}$ and $V_{LO}$ can be locally or individually generated for each source current cell. Alternately, a global reference voltage generator circuit, such as reference voltage generator 16 of FIG. 1(c), can be used for the entire array of current source cells.

In an array of current source cells, the output terminals O1 of all the current source cells in the array are coupled together while the output terminals O2 of all the current source cells in the array are coupled together. The data signal $D_K$ driving each of the current source cells determines the total output current value for the positive output current $I_{OP}$ and the negative output current $I_{ON}$ for the array.

In the present description, it is assumed that voltage $V_{HI}$ is greater than $V_{LO}$ and that switches S1 to S4 are closed when the control signal driving the switch is at a logical "1" level. Thus, when $Q_K=1$, switch S2 on transistor $M_{S1}$ side is closed and voltage $V_p$ is driven to voltage $V_{LO}$. Meanwhile, switch S3 on transistor $M_{S2}$ side is closed and voltage $V_n$ is driven to voltage $V_{HI}$. Thus, the source current $I_O$ is steered through transistor $M_{S1}$ and output current $I_{OP}$ at output terminal O1 is approximately equal to source current $I_O$ while output current $I_{ON}$ at output terminal O2 is about zero. The reverse applies when control signal $Q_K$ is at a logical "0" level. As thus configured, when $Q_K$ is at a steady state, the transistor of the source coupled pair $M_{S1}$ and $M_{S2}$ that is turned on in the source current cell is biased in saturation while the transistor of the source coupled pair that is turned off is in weak inversion.

The conventional current source cells, such as current source cell 10 of FIG. 1, have many deficiencies. First, although the output transistor ($M_{S1}$ or $M_{S2}$) that is selected by control signal $Q_K$ is biased in saturation and should isolate the selected output terminal (O1 or O2) from the common source node 15, an attenuated and distorted copy of the voltage at the output node still appears at the common source node 15, disturbing the common source voltage $V_{CS}$.

Such a situation can occur in an array of current source cells when a first current source cell is in steady state while another current source cell is transitioning. At the first current source cell, assume that the control signal $Q_K$ has transitioned to a steady state value where transistor $M_{S1}$ is biased in saturation to select output terminal O1 so that source current $I_O$ is steered into output terminal O1. Because all the O1 terminals in the array are connected together, the voltage at output terminal O1 of the first current source cell may change due to switching of another current source cell in the array. The voltage change at output terminal O1 of the first current source cell is coupled through transistor $M_{S1}$ to the common source node 15 and an attenuated version of the voltage change at output terminal O1, attenuated by the gain of transistor $M_{S1}$, will appear in common source voltage $V_{CS}$.

Thus, in an array of current source cells, whenever the voltage at the output terminal of one of the cells changes, the voltages at the output terminals of the other cells also change correspondingly, introducing variations in the common source voltage of each current source cell. Varying the common source voltage of the current source cell is undesirable as changing the common source voltage $V_{CS}$ changes the output current $I_O$ of the cascode transistor $M_C$. Variations in the output current $I_O$ will affect the accuracy of the digital to analog conversion, resulting in harmonic distortion in the converted signal.

A small-signal analysis provides a first order estimate of the output voltage attenuation. Specifically, assuming $V_p=V_{LO}$, $V_n=V_{HI}$ so that transistor $M_{S1}$ is selected, then the common source voltage $V_{CS}$ can be given as:

$$V_{CS} \cong V_{OI} \frac{g_{dsl}}{g_{MSI}}, \quad (1)$$

where $g_{MS1}$ and $g_{ds1}$ are the small signal transconductance and drain-source conductance of transistor $M_{S1}$. For a high frequency output signal, this attenuation is increasingly reduced due to the capacitive components associated with transistor $M_{S1}$. As a result, because of the finite output impedance seen by looking into the drain terminal of the cascode transistor $M_C$, the actual current $I_O$ flowing through transistor $M_C$ will change depending on the common source voltage $V_{CS}$ at node 15. Since current $I_O$ flowing through transistor $M_C$ constitutes the contribution of this source current cell to the converted output current of the entire array, harmonic distortion that is code-dependent is introduced into the converted output value.

In sum, in the current source cell of FIG. 1, the output current ($I_{OP}$ or $I_{ON}$) available at the output terminals of the source coupled pair of transistors ($M_{S1}$ and $M_{S2}$) will have a value that is a function of both the state of the control signal $Q_K$ and the output voltage itself, which is undesirable. In an ideal current source cell, the output current provided by the current source cell should be independent of the output voltage at the output terminal.

Another deficiency of the current source cell in FIG. 1 relates to variations of the common source voltage due to switching of the selected current path in the current source cell. That is, transitioning the control signal $Q_K$ to steer the source current $I_O$ into a different current path can cause the common source voltage $V_{CS}$ to vary, thereby varying the output current $I_O$ supplied by the current source into the selected current path.

More specifically, when voltages $V_p$ and $V_n$ are transitioning, voltage $V_{CS}$ at the source terminals of transistors $M_{S1}$ and $M_{S2}$ will follow in order to keep the gate-to-source voltage $V_{GS}$ of transistor $M_C$ constant. As a result, the current $I_O$ provided by transistor $M_C$ will vary, ultimately resulting in harmonic distortion of the converter output current provided by the array of current source cell. The more the common source voltage $V_{CS}$ moves around, the more the converted output current is disturbed.

Therefore, it is desirable to provide a current source cell where the common source voltage can be kept constant despite changes in the selected current path or changes in the output voltage.

SUMMARY OF THE INVENTION

According to one embodiment of the present invention, a current source cell includes a current source providing a first current at a first node where variations of a first voltage at the first node results in variations of the first current, a first switch coupled between the first node and a first output terminal and having a control terminal, a second switch coupled between the first node and a second output terminal and having a control terminal, a control signal coupled to selectively apply a first drive voltage to the control terminal of a selected one of the first and second switches to cause the selected switch to close, thereby steering the first current to the corresponding one of the first and second output terminals, and a voltage adjustment circuit coupled to detect variations in the first voltage at the first node and vary the first drive voltage in response to the variations in the first voltage. The first drive voltage applied to the selected switch is varied to reduce the variations in the first voltage, thereby maintaining the first voltage at a substantially stable voltage value.

According to another aspect of the present invention, a method in a current source cell includes providing a first current at a first node where the first current is varied by a variation in a first voltage at the first node, steering the first current to a selected one of first and second current paths where the selected current path is selected by a control signal and driven to a first drive voltage, sensing a variation of the first voltage at the first node, and adjusting the first drive voltage in response to a variation in the first voltage. The first drive voltage is adjusted to reduce the variations in the first voltage, thereby maintaining the first voltage at a substantially stable voltage value.

The present invention is better understood upon consideration of the detailed description below and the accompanying drawings.

DETAILED DESCRIPTION OF THE PREFERRED EMBODIMENTS

In accordance with the principles of the present invention, a current source cell for use in a current steering digital-to-analog converter includes a current source coupled to a pair of current steering switches and a common node voltage adjustment circuit detecting changes in the common node voltage of the current steering switches and providing corrections to compensate for any change in the common node voltage. The common node voltage adjustment circuit forms a feedback loop in the current source cell operative to minimize the voltage swing of the common node voltage at the current steering switches. In particular, the control voltages driving the current steering switches are adjusted in a manner so as to counteract changes in the common node voltage. In this manner, the common node voltage of the current steering switches is kept substantially constant at a desired voltage level in operation.

More importantly, the common node voltage is made independent of the variations in the output voltages at the output terminals of the current source cell and independent of the switching of the selected current path. When the current source cell of the present invention is configured in an array to form a current steering D/A converter, the dynamic linearity of the current-steering D/A converter is improved because the attenuation between the output terminals and the common node of the current-steering switches is increased. Harmonic distortion of the converted output signal of the current steering D/A converter caused by the variation in the common node voltage of the current source cells is eliminated.

In one embodiment, the current steering switches are formed using a source-coupled pair of transistors. The common node voltage is therefore the common source voltage $V_{CS}$ of the source-coupled pair of transistors. The common node voltage adjustment circuit operates to minimize the common source voltage swing of the source-coupled pair of transistors in view of variations in the output voltages and changes in the selected current path.

Figure 1A:
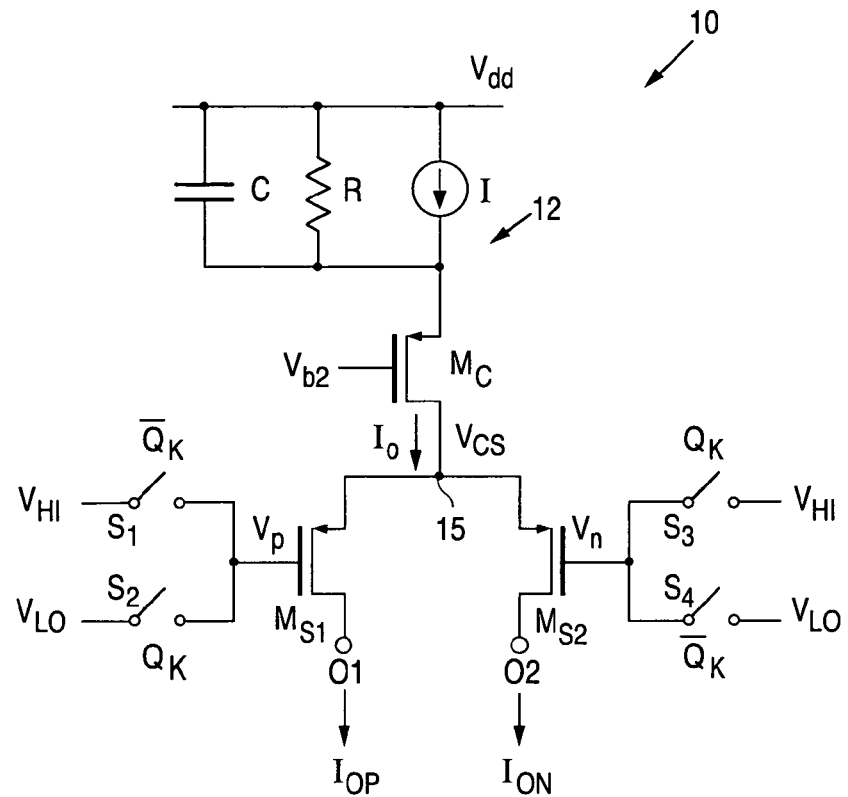
FIG. 1, which includes FIGS. 1(*a*), 1(*b*) and 1(*c*), is a circuit diagram of a conventional current source cell in a PMOS based implementation.
Figure 1:
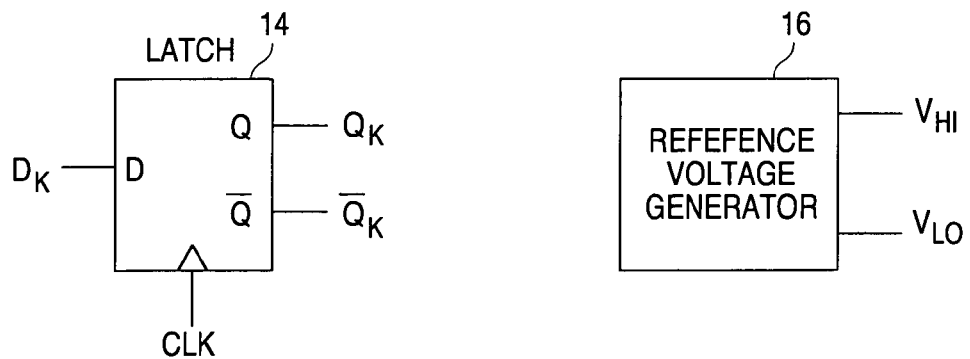
Figure 2:
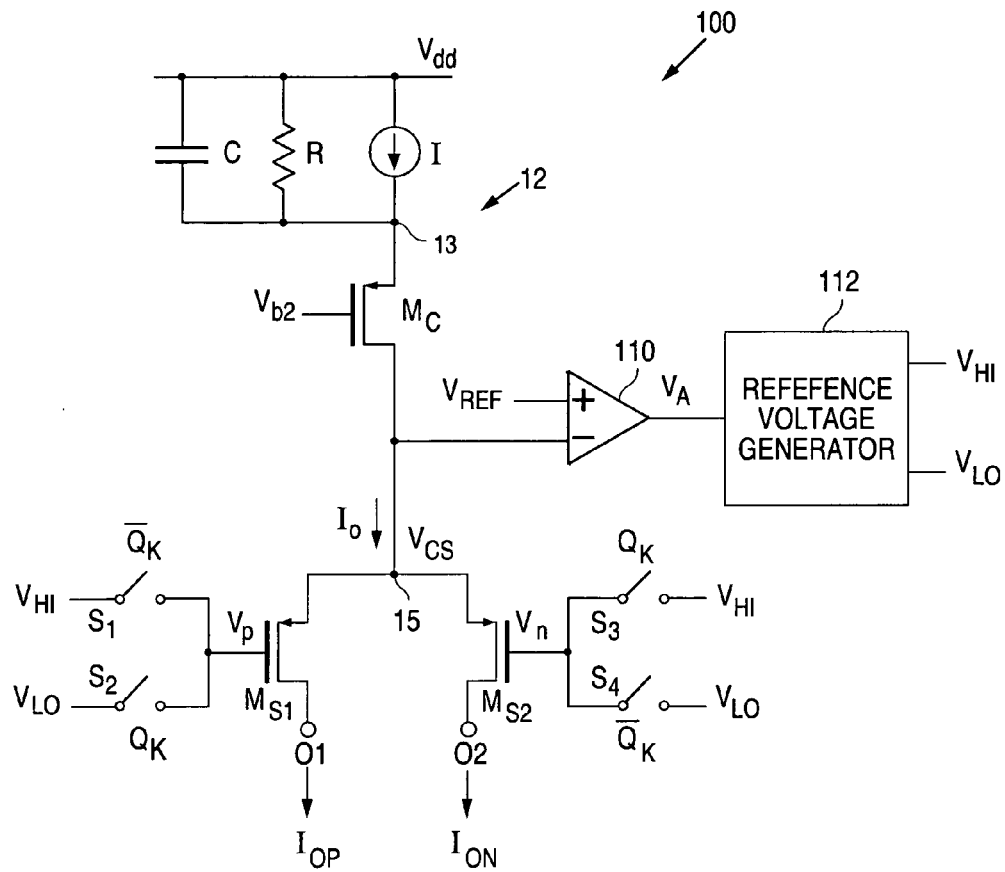
FIG. 2 is a circuit diagram of a current source cell according to one embodiment of the present invention.

FIG. 2 is a circuit diagram of a current source cell according to one embodiment of the present invention. In the embodiment shown in FIG. 2, the current source cell is constructed in a PMOS based implementation. One of ordinary skill in the art, upon being apprised of the present invention, would appreciate that the current source cell can also be implemented using NMOS transistors, or NPN bipolar transistors or PNP bipolar transistors. The voltage polarities of the current source cell can be accordingly modified when NMOS transistors or NPN bipolar transistors are used. The current source cell of FIG. 2 is constructed in substantially the same manner as the current source cell of FIG. 1 and like elements are given like reference numerals to simplify the discussion.

Referring to FIG. 2, a current source cell 100 in accordance with the present invention includes a current source 12 represented by a circuit model including a current source I, a capacitor C, and a resistor R, connected in parallel between the positive supply voltage Vdd and a node 13. The capacitor and resistor can be linear or nonlinear elements depending on the actual implementation. The parallel connection of current source I, capacitor C and resistor R in FIG. 2 is a representation of the current generating circuit in current source 12 and is not intended to be the actual current generating circuit. Current generating circuits or current source circuits are well known and current source 12 can be implemented using any current source circuits known or to be developed. Current source 12 also includes an output device. In the present embodiment, a cascode transistor $M_C$ is used. Cascode transistor $M_C$ is a PMOS transistor and is biased by a gate voltage $V_{b2}$. The source terminal of transistor $M_C$ is coupled to node 13 to receive the current provided by current source I. The drain terminal of transistor $M_C$ (node 15) is the output terminal of current source 12 where the output current $I_O$ of current source 12 is provided. As described above, cascode transistor $M_C$ provides a DC output impedance magnification at the output terminal of current source 12.

Current source 12 is coupled to a current steering circuit including a pair of current steering switches. Specifically, the common node of the pair of current steering switches is coupled to the drain terminal (node 15) of output device transistor $M_C$ to receive the source current $I_O$. The output current $I_O$ from current source 12 is steered into one of two current paths formed by the current steering switches. As a result, the output current $I_O$ is steered completely to either a first output terminal O1 as output current $I_{OP}$ or a second output terminal O2 as output current $I_{ON}$. In the present embodiment, the current steering circuit is implemented as a source-coupled pair of PMOS transistors $M_{S1}$ and $M_{S2}$.

PMOS transistor $M_{S1}$ is controlled by a gate voltage $V_p$ and PMOS transistor $M_{S2}$ is controlled by a gate voltage $V_n$. Gate voltages $V_p$ and $V_n$ are determined by a control signal $Q_K$ and will be in opposite logic polarities so that only one of transistors $M_{S1}$ and $M_{S2}$ will be turned on at a time.

More specifically, gate voltages $V_p$ and $V_n$ are driven to a high reference voltage level $V_{HI}$ or a low reference voltage level $V_{LO}$ through respective switches S1–S4. In the present embodiment, in the first current path formed by transistor $M_{S1}$, the gate terminal of transistor $M_{S1}$ is coupled to the high reference voltage level $V_{HI}$ through a switch S1 and also coupled to the low reference voltage level $V_{LO}$ through a switch S2. In the second current path formed by transistor $M_{S2}$, the gate terminal of transistor $M_{S2}$ is coupled to the high reference voltage level $V_{HI}$ through a switch S3 and also coupled to the low reference voltage level $V_{LO}$ through a switch S4. Switches S2 and S3 are controlled by control signal $Q_K$ while switches S1 and S4 are controlled by the inverse of control signal $Q_K$. Consequently, for each logical value of control signal $Q_K$, only one of the gate voltages $V_p$ and $V_n$ will be driven to the low reference voltage level $V_{LO}$ for turning on the respective PMOS transistor. Thus, only one of transistors $M_{S1}$ and $M_{S2}$ will be turned on at a time by control signal $Q_K$.

In the present embodiment, switches S1 to S2 are responsive to a logical high control signal to close the switch and responsive to a logical low control signal to open the switch. When control signal $Q_K$ has a logical high value, switch S2 is closed and gate voltage $V_P$ is driven to the low reference voltage level $V_{LO}$ to turn on transistor $M_{S1}$. Thus, when control signal $Q_K=1$, the first current path is selected and current $I_O$ from current source 12 is steered into first output terminal O1 as current $I_{OP}$. Thus, the output current $I_{OP}$ at output terminal O1 is approximately equal to source current $I_O$ while output current $I_{ON}$ at output terminal O2 is about zero.

Alternately, when control signal $Q_K$ has a logical low value, switch S4 is closed and gate voltage $V_N$ is driven to the low reference voltage level $V_{LO}$ to turn on transistor $M_{S2}$. Thus, when control signal $Q_K=0$, the second current path is selected and current $I_O$ from current source 12 is steered into second output terminal O2 as current $I_{ON}$. Thus, the output current $I_{ON}$ at output terminal O2 is approximately equal to source current $I_O$ while output current $I_{OP}$ at output terminal O1 is about zero. Thus, depending on the state of control signal $Q_K$, one of the first and second current paths will be selected.

Figure 3:
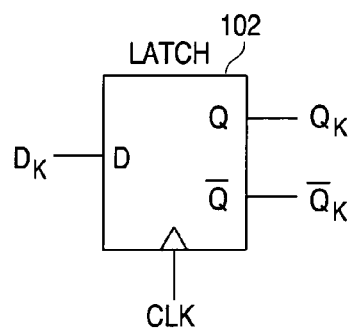
FIG. 3 is a schematic diagram of a latch circuit for generating control signals $Q_K$ and its inverse based on a data signal and a clock signal.

The control signal $Q_K$ is related to the digital data signal to be converted into analog format. Control signal $Q_K$ can be generated in a variety of ways. In the present illustration, control signal $Q_K$ is generated by a latch 103 as shown in FIG. 3. Latch 103 receives the data signal $D_K$ and is clocked by a clock signal CLK to provide $Q_K$ and its inverse. Other methods for generating the control signal $Q_K$ can be used and the particular method for generating control signal $Q_K$ is not critical to the practice of the present invention. In an array of current source cells forming a D/A converter, the output terminals O1 of all the current source cells in the array are coupled together while the output terminals O2 of all the current source cells in the array are coupled together. The data signal $D_K$ driving each of the current source cells determines the total output current values for the positive output current $I_{OP}$ and the negative output current $I_{ON}$ for the array, representing the digital-to-analog converted output value for the D/A converter.

As described above, operation of the current source cell, such as changes in the voltage at the output terminals or switching of the selected current path, can cause the common source voltage of the source-coupled pair to move around. Variation in the common source voltage is not desirable as the voltage variation results in variation of the source current $I_O$. In accordance with the present invention, current source cell 100 further includes a common source voltage adjustment circuit forming a feedback loop in the current source cell for detecting changes in the common source voltage of the current steering switches and compensating for any common source voltage change.

Referring to FIG. 2, the common source voltage adjustment circuit of current source cell 100 includes an error amplifier 110 and a variable reference voltage generator 112. Error amplifier 110 has a positive input terminal coupled to a reference voltage $V_{REF}$ and a negative input terminal coupled to the common source voltage $V_{CS}$ at node 15. Error amplifier 110 monitors the common source voltage $V_{CS}$ and determines if the common source voltage has drifted out of a desired range, as established by reference voltage $V_{REF}$. Error amplifier 110 provides an error output voltage $V_A$ indicative of the difference between the reference voltage $V_{REF}$ and the common source voltage $V_{CS}$.

The error output voltage $V_A$ is coupled to control the variable reference voltage generator 112. Reference voltage generator 112 generates the high reference voltage level $V_{HI}$ and the low reference voltage level $V_{LO}$ which are coupled to switches S1 to S4 for driving the gate terminals of the source-coupled pair of transistors $M_{S1}$ and $M_{S2}$. The high reference voltage level $V_{HI}$ and the low reference voltage level $V_{LO}$ each has voltage value that is adjusted from a base voltage level according to the error output voltage $V_A$ from error amplifier 110 in a manner so as to counter the changes in common source voltage $V_{CS}$ detected by the error amplifier.

More specifically, error amplifier 110 amplifies the voltage difference $V_E$ between the reference voltage $V_{REF}$ and the common source voltage $V_{CS}$. That is, $V_E = V_{REF} - V_{CS}$ and the error output voltage $V_A = A*V_E$ where A is the gain of error amplifier 110. Reference voltage $V_{REF}$ is selected to be equal to the quiescent potential of the common source voltage $V_{CS}$ when the selected switch ($M_{S1}$ or $M_{S2}$) is on and the output terminal (O1 or O2) is held at the output common mode level. The error output voltage $V_A$ drives reference voltage generator 112 to generate the high and low reference voltage levels $V_{HI}$ and $V_{LO}$. In the present embodiment, voltages $V_{HI}$ and $V_{LO}$ increase monotonically with increasing error output voltage $V_A$ and decrease monotonically with decreasing error output voltage $V_A$.

The operation of the common source adjustment circuit in attenuating the voltage swing of the common source voltage $V_{CS}$ in current source cell 100 is accomplished as follows. When the common source voltage $V_{CS}$ increases from the desired set point as established by reference voltage $V_{REF}$, error output voltage $V_A$ is proportionally decreased. The decrease in error output voltage $V_A$ is coupled to reference voltage generator 112 to cause reference voltage levels $V_{HI}$ and $V_{LO}$ to correspondingly decrease. As the low reference voltage level $V_{LO}$ decreases, the current steering switch (transistor $M_{S1}$ or $M_{S2}$) that is selected by one of switches S1 to S4 will be driven by a decreasing gate voltage $V_p$ or $V_n$. As a result, the decrease in gate voltage driving the selected current steering switch will force the common source voltage $V_{CS}$ to decrease and such decrease goes against the original increase in the common source voltage $V_{CS}$.

The same correction response results when the common source voltage $V_{CS}$ decreases from the desired set point as established by reference voltage $V_{REF}$. When the common source voltage $V_{CS}$ decreases from the desired set point, error output voltage $V_A$ is proportionally increased. The increase in error output voltage $V_A$ is coupled to reference voltage generator 112 to cause reference voltage levels $V_{HI}$ and $V_{LO}$ to correspondingly increase. As reference voltage level $V_{LO}$ increases, the current steering switch (transistor $M_{S1}$ or $M_{S2}$) that is selected by one of switches S1 to S4 will be driven by an increasing gate voltage $V_p$ or $V_n$. As a result, the increase in gate voltage driving the selected current steering switch will force the common source voltage $V_{CS}$ to increase and such increase goes against the original decrease in the common source voltage $V_{CS}$.

Thus, the feedback loop established by the common source voltage adjustment circuit operates to counteract any variation in the common source voltage $V_{CS}$ by forcing the reference voltage levels to vary in a manner so as to cancel out the variation in the common source voltage. In current source cell 100, the current steering switches are implemented using PMOS transistors and therefore, the low reference voltage level $V_{LO}$, used to turn on the selected PMOS transistor, is the relevant voltage to which voltage adjustment should be applied. However, in the present embodiment, voltage adjustment is applied to both the high and the low reference voltage levels $V_{HI}$ and $V_{LO}$. In other embodiments, the reference voltage generator circuit may be configured to only vary the relevant reference voltage level. The relevant reference voltage level is the reference voltage used to turn on the selected current steering switch. For instance, when the current steering switch is a PMOS transistor, the relevant reference voltage level is the low reference voltage level $V_{LO}$. When the current steering switch is an NMOS transistor, the relevant reference voltage level will be the high reference voltage level $V_{HI}$. The other reference voltage level can be provided as a fixed reference voltage.

By incorporating the common source voltage adjustment circuit in current source cell 100, the common source voltage for the current source cell can be compensated so that the source current $I_O$ steered into one of the current paths remain stable. When current source cell 100 is formed into an array to implement a D/A converter, the common source voltage adjustment in each current source cell allows each cell to be individually and independently corrected, thereby achieving high accuracy in compensation.

Figure 4:
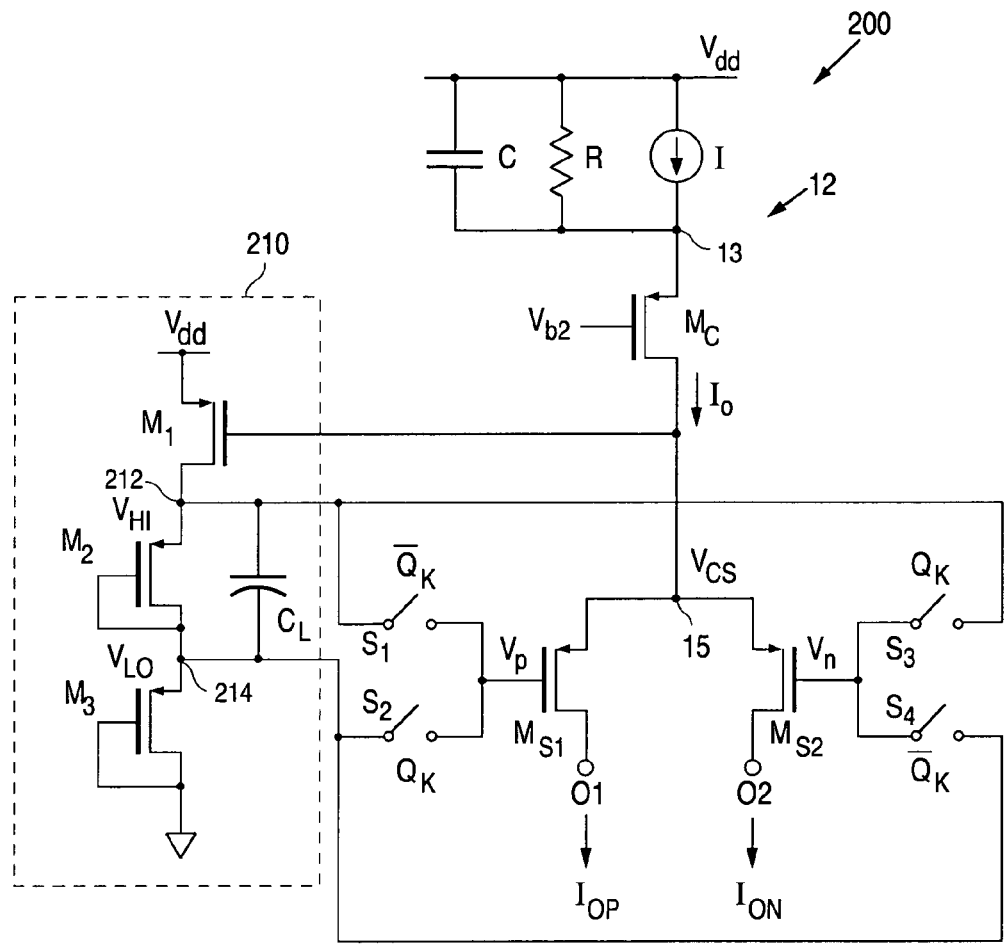
FIG. 4 illustrates a transistor level implementation of the common source voltage adjustment circuit in a current source cell according to one embodiment of the present invention.

The common source voltage adjustment circuit of current source cell 100, including error amplifier 110 and variable voltage reference generator 112, can be implemented in numerous ways, as understood by one of ordinary skill in the art. FIG. 4 illustrates a transistor level implementation of the common source voltage adjustment circuit in a current source cell according to one embodiment of the present invention. Like elements in FIGS. 2 and 4 are given like reference numerals to simplify the discussion.

Figure 5:
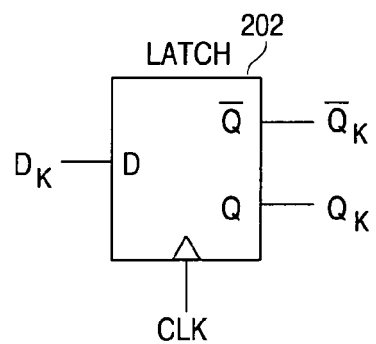
FIG. 5 is a schematic diagram of a latch circuit for generating control signals $Q_K$ and its inverse based on a data signal and a clock signal.

Referring to FIG. 4, current source cell 200 is constructed in the same manner as current source cell 100 of FIG. 2 and includes a current source 12 providing a source current $I_O$ at the common source node (node 15) and a pair of current steering switches (transistors $M_{S1}$ and $M_{S2}$) controlled by switches S1 to S4. The control signal $Q_K$ and its inverse can be provided by a latch, such as latch 202 shown in FIG. 5. In current source cell 200, a common source voltage adjustment circuit 210 is incorporated for compensating for the changes in the common source voltage $V_{CS}$. In FIG. 4, common source voltage adjustment circuit 210 is implemented using PMOS transistors $M_1$, $M_2$ and $M_3$ connected in series between the Vdd voltage and the ground voltage. In the embodiment shown in FIG. 4, transistors $M_1$ to $M_3$ implement the error amplifier and the variable reference voltage generator of the common source voltage adjustment circuit. The reference voltage $V_{REF}$ is defined implicitly by the biasing of the overall circuit 210. Specifically, voltage $V_{REF}$ is the average value of the common source voltage $V_{CS}$ where the average value is defined as the voltage value at the common source node (node 15) when the gate voltages $V_p$ and $V_n$ are equal.

In common source voltage adjustment circuit 210, transistor $M_1$ has a gate terminal biased by the common source voltage $V_{CS}$. Any changes in the common source voltage $V_{CS}$ will change the gate bias for transistor $M_1$ and therefore also change the drain current conducted by transistor $M_1$. Transistors $M_2$ and $M_3$ are both diode connected. That is, the gate and drain terminals of each of the transistor are shorted together. When transistor $M_1$ varies its drain current, the current conducted through transistors $M_2$ and $M_3$ is varied accordingly. The voltage at the source terminal (node 212) of transistor $M_2$ and the source terminal (node 214) of transistor $M_3$ will vary according to the current that is forced through the transistors. The high reference voltage level $V_{HI}$ generated at the source terminal of transistor $M_2$ (node 212) and the low reference voltage level $V_{LO}$ generated at the source terminal of transistor $M_3$ (node 214) are thereby varied as a result of the changes in the current conducted by transistor $M_1$. The changes in the high and low reference voltage levels are applied to counteract the changes in the common source voltage $V_{CS}$ so that the common source voltage remains constant over changes in output voltage at the output terminals O1 and O2 or changes in the selected current path in the current source cell.

In common source voltage adjustment circuit 210, a capacitor $C_L$ is coupled between the high reference voltage output node (node 212) and the low reference voltage output node (node 214) to stabilize the feedback loop. Furthermore, capacitor $C_L$ serves as a charge reservoir to replenish the charge displaced by the switches $M_{S1}$ and $M_{S2}$ when the selected current path is changed. The use of capacitor $C_L$ for stabilization of the feedback loop is illustrative only and in other embodiments, other methods for stabilization a feedback loop, currently known or to be developed, may be applied to the common source voltage adjustment circuit of the present invention.

Figure 6:
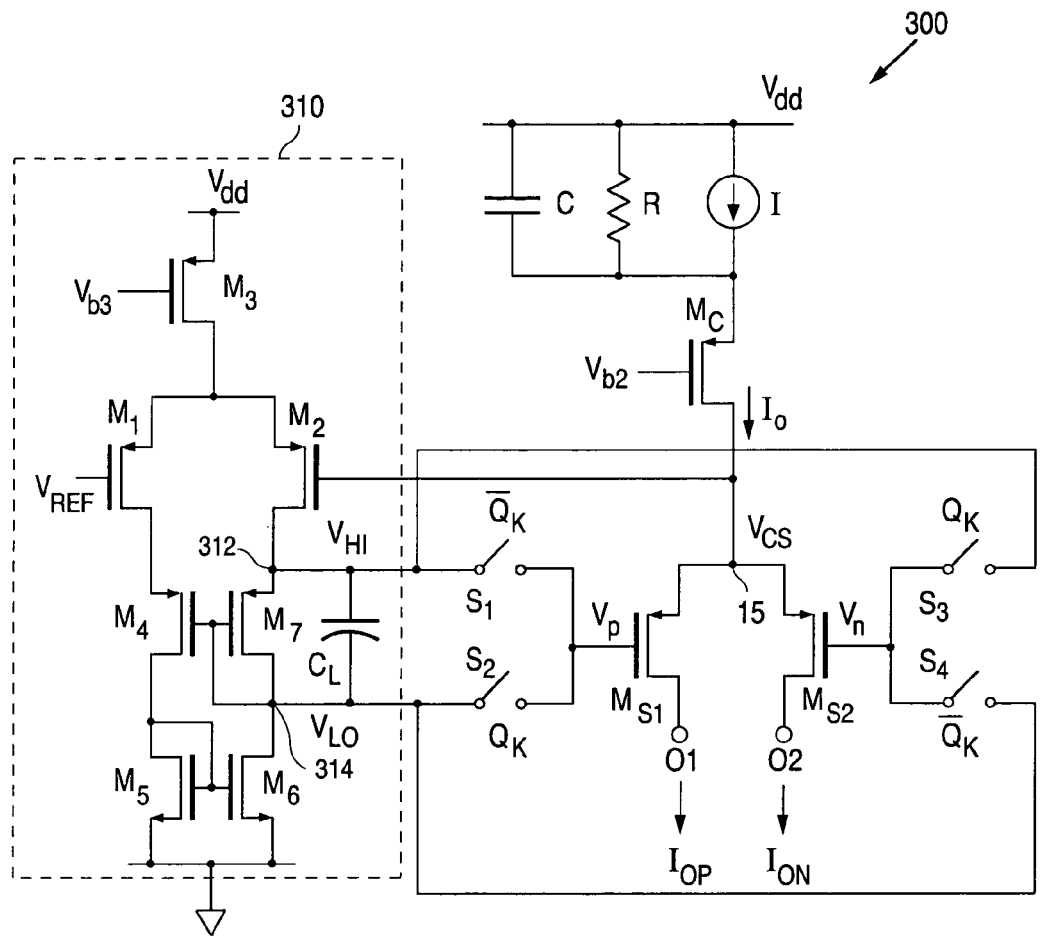
FIG. 6 illustrates a transistor level implementation of the common source voltage adjustment circuit in a current source cell according to an alternate embodiment of the present invention.

FIG. 6 illustrates a transistor level implementation of the common source voltage adjustment circuit in a current source cell according to an alternate embodiment of the present invention. Like elements in FIGS. 2 and 6 are given like reference numerals to simplify the discussion. In current source cell 300 of FIG. 6, the common source voltage adjustment circuit 310 is implemented using a differential pair of PMOS transistors $M_1$ and $M_2$ with a tail current source formed by transistor $M_3$ that is biased by a gate voltage $V_{b3}$. The reference voltage $V_{REF}$ is applied to the gate terminal of transistor $M_1$ while the common source voltage $V_{CS}$ is applied to the gate terminal of transistor $M_2$. The differential pair of transistors amplify the difference between the voltages at the gate terminals of transistors $M_1$ and $M_2$. The current provided by transistor $M_2$ is steered into a respective one of transistors $M_1$ and $M_2$ depending on the gate voltage values of the two transistors.

PMOS transistor $M_4$ and $M_7$ and NMOS transistor $M_5$ and $M_6$ constitute the variable reference voltage generator for generating the high and low reference voltage levels $V_{HI}$ and $V_{LO}$. Transistors $M_4$ and $M_7$ form a first current mirror while transistors $M_5$ and $M_6$ form a second current mirror. The first and second current mirrors function as output load circuit for the differential pair of transistors The high reference voltage level $V_{HI}$ is generated at the source terminal (node 312) of PMOS transistor $M_7$ while the low reference voltage level $V_{LO}$ is generated at the drain terminal (node 314) of NMOS transistor $M_6$.

Figure 7:
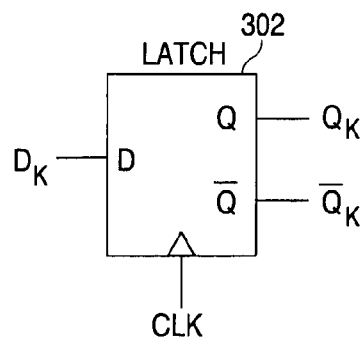
FIG. 7 is a schematic diagram of a latch circuit for generating control signals $Q_K$ and its inverse based on a data signal and a clock signal.

In common source voltage adjustment circuit 310 of FIG. 6, a capacitor $C_L$ is also coupled between the high reference voltage output node (node 312) and the low reference voltage output node (node 314) for feedback loop stabilization and to also serve as a charge reservoir as discussed above. Other methods for providing stabilization in the feedback loop of current source cell 300 can also be used. A latch circuit, such as latch 302 of FIG. 7, can be used to generate the control signals QK and its inverse for driving switches S1 to S4.

The embodiment of the common source voltage adjustment circuit has an advantage over the circuit of FIG. 4 in that the reference voltage $V_{REF}$ can be independently set apart from the biasing of the circuit. Therefore, circuit 310 allows an extra degree of freedom in the selection of the reference voltage $V_{REF}$. Another advantage of circuit 310 is that the circuit can have similar loop bandwidth than circuit 210 of FIG. 4 while contributing much smaller capacitive loading to the common source voltage node (node 15).

In the embodiments of common source voltage adjustment circuits shown in FIGS. 4 and 6, the common source voltage adjustment circuits adjust both the high reference voltage level $V_{HI}$ and the low reference voltage level $V_{LO}$. As described above, the common source voltage adjustment circuits of FIGS. 4 and 6 can be used to provide only the relevant reference voltage level while the other reference voltage level can be provided as a fixed voltage level. When the current steering switches are PMOS transistors, the relevant reference voltage level is the low reference voltage level $V_{LO}$ and when the current steering switches are NMOS transistors, the relevant reference voltage level is the high voltage reference level $V_{HI}$.

The above detailed descriptions are provided to illustrate specific embodiments of the present invention and are not intended to be limiting. Numerous modifications and variations within the scope of the present invention are possible. For example, the current source in the current source cell providing the source current can be implemented using a variety of current source circuits and a variety of output devices. The output device for the current source can be an NMOS transistor or an N-type or P-type bipolar transistor. The present invention is defined by the appended claims.

I claim:

1. A current source cell, comprising:
  a current source providing a first current at a first node, wherein variations of a first voltage at the first node results in variations of the first current;
  a first switch coupled between the first node and a first output terminal and having a control terminal;
  a second switch coupled between the first node and a second output terminal and having a control terminal;
  a control signal coupled to selectively apply a first drive voltage to the control terminal of a selected one of the first and second switches to cause the selected switch to close, thereby steering the first current to the corresponding one of the first and second output terminals; and
  a voltage adjustment circuit coupled to detect variations in the first voltage at the first node and vary the first drive voltage in response to the variations in the first voltage, wherein the first drive voltage applied to the selected switch is varied to reduce the variations in the first voltage, thereby maintaining the first voltage at a substantially stable voltage value.

2. The current source cell of claim 1, wherein the voltage adjustment circuit comprises:
an error amplifier having a first input terminal coupled to receive a first reference voltage, a second input terminal coupled to the first node receiving the first voltage, and an output terminal providing an error output voltage indicative of a difference between the first reference voltage and the first voltage;
a variable voltage generating circuit coupled to receive the error output voltage of the error amplifier and generate the first drive voltage, wherein the first drive voltage has a voltage value that varies about a base voltage value in response to the error output voltage.

3. The current source cell of claim 1, wherein the control signal is coupled to selectively apply the first drive voltage to the control terminal of the selected switch and is further coupled to selectively apply a second drive voltage to the control terminal of the other one of the first and second switches not selected to cause the non-selected switch to open, thereby preventing the first current from flowing into the corresponding one of the first and second output terminals.

4. The current source cell of claim 3, wherein the voltage adjustment circuit vary the second drive voltage in response to the variations in the first voltage.

5. The current source cell of claim 1, wherein the current source comprises:
a current generating circuit providing a second current; and
an output device receiving the second current and providing the first current at the first node.

6. The current source cell of claim 5, wherein the output device comprises a transistor having a control terminal coupled to a first bias voltage, a first current handling terminal coupled to receive the second current and a second current handling terminal coupled to the first node providing the first current.

7. The current source cell of claim 6, wherein the transistor comprises an MOS transistor.

8. The current source cell of claim 1, wherein:
the first switch comprises a first transistor having a control terminal being selectively driven to the first drive voltage under the control of the control signal, a first current handling terminal coupled to the first node and a second current handling terminal coupled to the first output terminal; and
the second switch comprises a second transistor having a control terminal being selectively driven to the first drive voltage under the control of the control signal, a first current handling terminal coupled to the first node and a second current handling terminal coupled to the second output terminal;
wherein variations in the first drive voltage cause a change in the voltage driving the control terminal of the selected one of the first and second transistors, thereby causing a corresponding change in the voltage at the first current handling terminal of the selected transistors, the change in voltage at the first current handling terminal canceling the variations of the first voltage at the first node.

9. The current source cell of claim 8, wherein the first transistor and the second transistors each comprises an MOS transistor.

10. The current source cell of claim 9, wherein the first drive voltage comprises a gate voltage for turning on the selected one of the first and second transistors.

11. The current source cell of claim 3, further comprising:
a third switch coupled between the control terminal of the first switch and the first drive voltage, the third switch having a control terminal driven by the control signal;
a fourth switch coupled between the control terminal of the first switch and the second drive voltage, the fourth switch having a control terminal driven by an inverse of the control signal;
a fifth switch coupled between the control terminal of the second switch and the second drive voltage, the fifth switch having a control terminal driven by the control signal;
a sixth switch coupled between the control terminal of the second switch and the first drive voltage, the sixth switch having a control terminal driven by the inverse of the control signal;
wherein the control signal has a first value for closing the third and fifth switches to apply the first drive voltage to the control terminal of the first switch, and the control signal has a second value for closing the fourth and sixth switches to apply the first drive voltage to the control terminal of the second switch.

12. The current source cell of claim 4, wherein the voltage adjustment circuit comprises:
a first transistor having a control terminal coupled to the first node receiving the first voltage, a first current handling terminal coupled to a first power supply voltage, and a second current handling terminal coupled to a second node;
a second transistor having a first current handling terminal coupled to the second node, and a control terminal and a second current handling terminal both coupled to a third node;
a third transistor having a first current handling terminal coupled to the third node, and a control terminal and a second current handling terminal both coupled to a second power supply voltage,
wherein the first drive voltage is selected from a voltage at the second node or a voltage at the third node while the second drive voltage is selected from the voltage at the other one of the second or third node.

13. The current source cell of claim 12, wherein when the first switch and the second switch comprise first and second NMOS transistors or first and second NPN bipolar transistors, the first drive voltage is selected from the voltage at the second node while the second drive voltage is selected from the voltage at the third node.

14. The current source cell of claim 12, wherein when the first switch and the second switch comprise first and second PMOS transistors or first and second PNP bipolar transistors, the first drive voltage is selected from the voltage at the third node while the second drive voltage is selected from the voltage at the second node.

15. The current source cell of claim 12, wherein the voltage adjustment circuit further comprises a compensation capacitor coupled between the second node and the third node.

16. The current source cell of claim 4, wherein the voltage adjustment circuit comprises:
a differential pair comprising:
a first transistor having a control terminal coupled to a first reference voltage, a first current handling terminal coupled to a common node, and a second current handling terminal being a first output node of the differential pair;

a second transistor having a control terminal coupled to the first node receiving the first voltage, a first current handling terminal coupled to the common node, and a second current handling terminal being a second output node of the differential pair;

a tail current source between coupled between the common node and a first power supply voltage;

a first current mirror and a second current mirror connected in series between the first and second output nodes of the differential pair and a second power supply voltage, wherein the first drive voltage is selected from a voltage at the second output node of the differential pair or a voltage at a second node between the first and second current mirrors while the second drive voltage is selected from the voltage at the other one of the second output node of the differential pair or the second node between the first and second current mirrors.

17. The current source cell of claim 16, wherein when the first switch and the second switch comprise first and second NMOS transistors or first and second NPN bipolar transistors, the first drive voltage is selected from the voltage at the second output node of the differential pair while the second drive voltage is selected from the voltage at the second node.

18. The current source cell of claim 16, wherein when the first switch and the second switch comprise first and second PMOS transistors or first and second PNP bipolar transistors, the first drive voltage is selected from the voltage at the second node while the second drive voltage is selected from the voltage at the second output node of the differential pair.

19. The current source cell of claim 16, wherein the voltage adjustment circuit further comprises a compensation capacitor coupled between the second output node of the differential pair and the second node.

20. A method in a current source cell, comprising
providing a first current at a first node, the first current being varied by a variation in a first voltage at the first node;

steering the first current to a selected one of first and second current paths, the selected current path being selected by a control signal and driven to a first drive voltage;

sensing a variation of the first voltage at the first node;

adjusting the first drive voltage in response to a variation in the first voltage, the first drive voltage being adjusted to reduce the variations in the first voltage, thereby maintaining the first voltage at a substantially stable voltage value.

21. The method of claim 20, wherein sensing a variation of the first voltage at the first node comprises detecting a difference between the first voltage and a first reference voltage.

* * * * *